(12) United States Patent
Adiga et al.

(10) Patent No.: US 10,930,987 B2
(45) Date of Patent: *Feb. 23, 2021

(54) MICROFABRICATED AIR BRIDGES FOR PLANAR MICROWAVE RESONATOR CIRCUITS

(71) Applicant: International Business Machines Corporation, Armonk, NY (US)

(72) Inventors: Vivekananda P. Adiga, Ossining, NY (US); Markus Brink, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/534,249

(22) Filed: Aug. 7, 2019

(65) Prior Publication Data

US 2019/0363418 A1 Nov. 28, 2019

Related U.S. Application Data

(63) Continuation of application No. 15/705,303, filed on Sep. 15, 2017, now Pat. No. 10,431,866.

(51) Int. Cl.
*H01P 3/02* (2006.01)
*H01L 21/3205* (2006.01)
(Continued)

(52) U.S. Cl.
CPC .............. *H01P 3/026* (2013.01); *H01B 12/06* (2013.01); *H01L 21/32058* (2013.01);
(Continued)

(58) Field of Classification Search
CPC ........... H01B 12/06; H05H 7/20; H01P 3/026; H01L 21/76891; H01L 21/32058
(Continued)

(56) References Cited

U.S. PATENT DOCUMENTS

| 4,670,297 A | 6/1987 | Lee et al. |
| 5,117,207 A | 5/1992 | Powell et al. |

(Continued)

FOREIGN PATENT DOCUMENTS

| JP | 2014165304 A | 9/2014 |
| WO | 2019053497 A1 | 3/2019 |

OTHER PUBLICATIONS

Abuwasib et al., "Fabrication of large dimension aluminum air-bridges for superconducting quantum circuits," Journal of American Vacuum Science and Technology B, vol. 31, No. 3, 2013, 6 pages.
(Continued)

*Primary Examiner* — Binh X Tran
(74) *Attorney, Agent, or Firm* — Jared C. Chaney

(57) ABSTRACT

The present invention provides a process and structure of microfabricated air bridges for planar microwave resonator circuits. In an embodiment, the invention includes depositing a superconducting film on a surface of a base material, where the superconducting film is formed with a compressive stress, where the compressive stress is higher than a critical buckling stress of a defined structure, etching an exposed area of the superconducting film, thereby creating the at least one bridge, etching the base material, thereby forming a gap between the at least one bridge and the base material, depositing the at least one metal line on at least part of the superconducting film and at least part of the base material, where the at least one metal line runs under the bridge.

16 Claims, 11 Drawing Sheets

(51) Int. Cl.
*H01L 21/768* (2006.01)
*H05H 7/20* (2006.01)
*H01L 23/482* (2006.01)
*H01B 12/06* (2006.01)
*H01P 11/00* (2006.01)

(52) U.S. Cl.
CPC .... *H01L 21/76891* (2013.01); *H01L 23/4821* (2013.01); *H01P 11/003* (2013.01); *H05H 7/20* (2013.01)

(58) Field of Classification Search
USPC ................................ 438/700, 720, 725, 742
See application file for complete search history.

(56) References Cited

U.S. PATENT DOCUMENTS

| | | | |
|---|---|---|---|
| 5,194,833 | A | 3/1993 | Dougherty et al. |
| 5,846,911 | A | 12/1998 | Freyhardt et al. |
| 9,177,814 | B2 | 11/2015 | Chang et al. |
| 9,455,392 | B2 | 9/2016 | Abraham et al. |
| 9,524,470 | B1 | 12/2016 | Chow et al. |
| 9,564,573 | B1 | 2/2017 | Chang et al. |
| 9,614,270 | B2 | 4/2017 | Chang et al. |
| 10,431,866 | B2 * | 10/2019 | Adiga .................... H01P 3/026 |
| 2005/0011673 | A1 | 1/2005 | Wong et al. |
| 2006/0110525 | A1 | 5/2006 | Indech |
| 2012/0025204 | A1 * | 2/2012 | Yamaki ................. H01L 23/147 257/77 |
| 2016/0322693 | A1 | 11/2016 | Chang et al. |
| 2018/0013052 | A1 * | 1/2018 | Oliver ................. H01L 25/0652 |
| 2019/0006572 | A1 * | 1/2019 | Falcon .................... G06N 10/00 |
| 2019/0089033 | A1 | 3/2019 | Adiga et al. |
| 2019/0305038 | A1 * | 10/2019 | Michalak ................ H01L 27/18 |

OTHER PUBLICATIONS

Chen et al., "Fabrication and characterization of aluminum airbridges for superconducting microwave circuits," Applied Physics Letters, vol. 104, No. 5, 2014, 4 pages.

Fu et al., "Gas-assisted etching of niobium with focused ion beam," Microelectronic Engineering, vol. 78, 2005, 5 pages.

Schicke et al., "Integrated Niobium Thin Film Air Bridges as Variable Capacitors for Superconducting GHz Electronic Circuits;" IEEE Transactions on Applied Superconductivity, vol. 13, No. 2, 2003, 3 pages.

Adiga et al., "Microfabricated Air Bridges for Planar Microwave Resonator Circuits," U.S. Appl. No. 15/705,303, filed Sep. 15, 2017.

List of IBM Patents or Patent Applications Treated as Related, Dated Aug. 6, 2019, 2 pages.

* cited by examiner

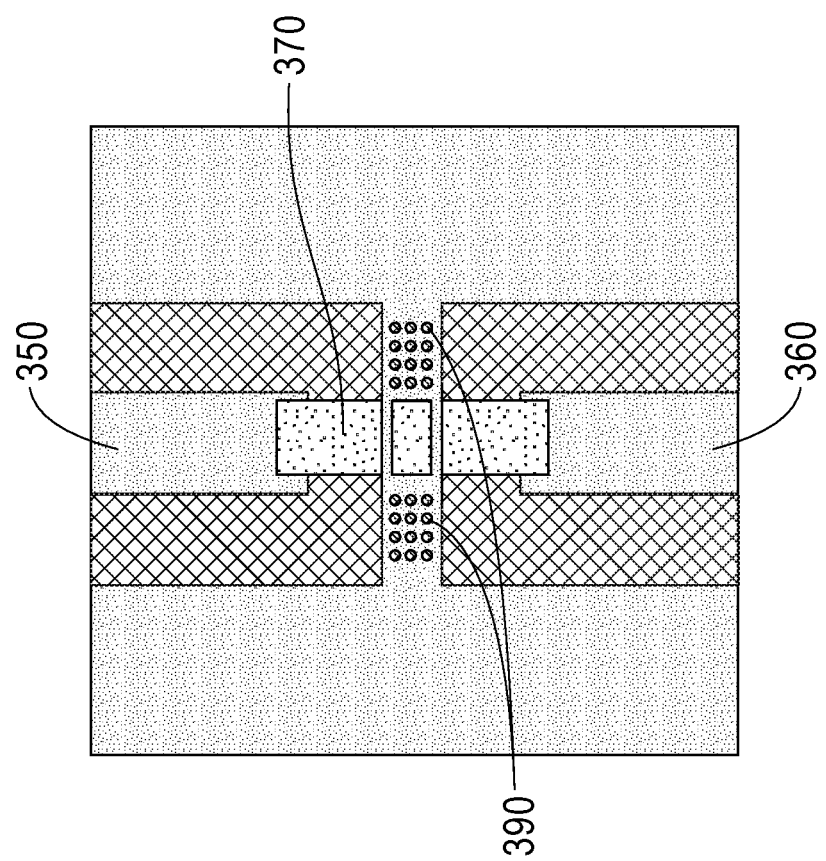
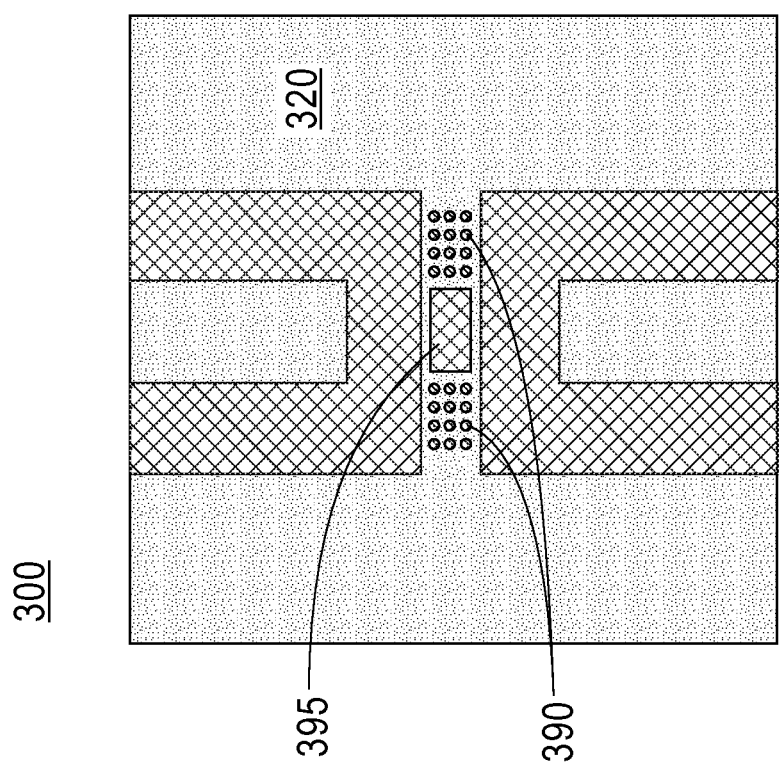
FIG. 3A
FIG. 3B

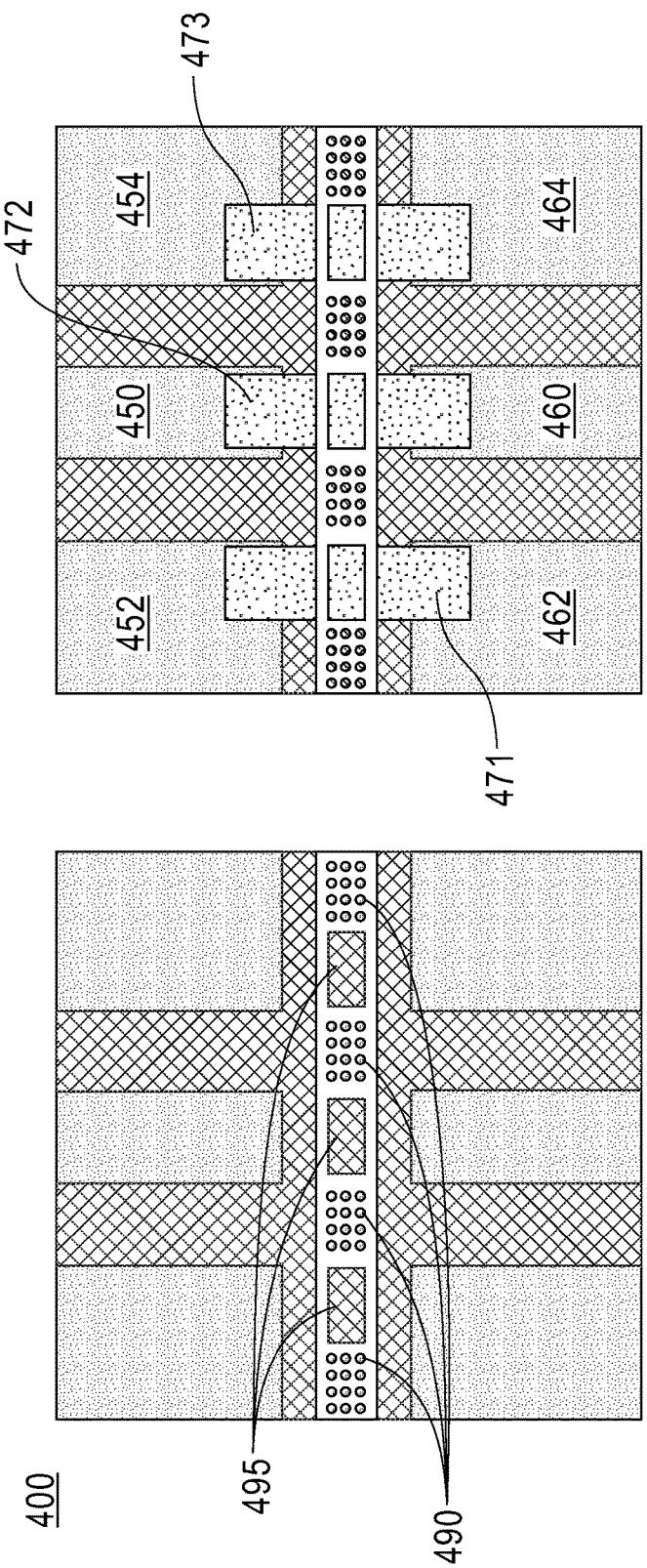
FIG. 4A
FIG. 4B
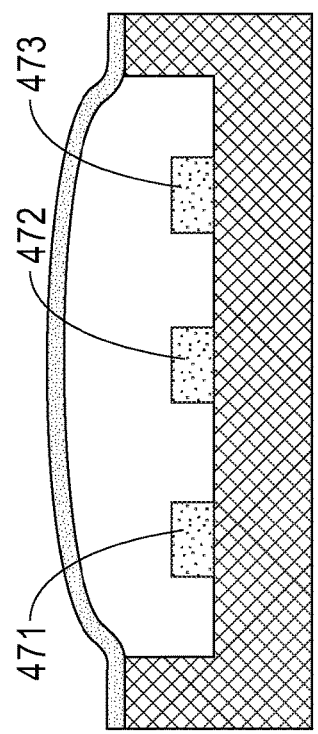
FIG. 4C

MICROFABRICATED AIR BRIDGES FOR PLANAR MICROWAVE RESONATOR CIRCUITS

BACKGROUND

The present disclosure relates to integrated circuit chips, and more specifically, to microfabricated air bridges for planar microwave resonator circuits.

SUMMARY

The present invention provides a process and structure of microfabricated air bridges for planar microwave resonator circuits. In an embodiment, the process includes depositing a superconducting film on a surface of a base material, where the superconducting film is formed with a compressive stress, where the compressive stress is higher than a critical buckling stress of a defined structure, forming a first photoresist pattern on the superconducting film, where the photoresist pattern defines at least one bridge etching an exposed area of the superconducting film, thereby creating the at least one bridge, etching the base material, thereby forming a gap between the at least one bridge and the base material, forming a second photoresist pattern on at least a defined surface of the base material, where the second photoresist pattern defines a space for at least one metal line, cleaning at least a part of the surface of the superconducting film, depositing the at least one metal line on at least part of the superconducting film and at least part of the base material, where the at least one metal line connects a first part of the superconducting film and a second part of the superconducting film, where the at least one metal line runs under the bridge, and removing the second photoresist pattern.

In an alternative embodiment, the process includes depositing a first superconducting film on a surface of a base material, depositing a second superconducting film on a surface of the first superconducting film, where the second superconducting film is formed with a compressive stress, where the compressive stress is higher than a critical buckling stress of a defined structure, forming a first photoresist pattern on the second superconducting film, where the photoresist pattern defines at least one bridge, etching an exposed area of the second superconducting film, thereby creating the at least one bridge, etching the first superconducting film, thereby forming a gap between the at least one bridge and the base material, forming a second photoresist pattern on at least a defined surface of the base material, where the second photoresist pattern defines a space for at least one metal line, cleaning at least a part of a surface of the second superconducting film, depositing the at least one metal line on at least part of the second superconducting film and at least part of the base material, where the at least one metal line connects a first part of the second superconducting film and a second part of the second superconducting film, where the at least one metal line runs under the bridge, and removing the second photoresist pattern.

In an embodiment, the structure includes a base material, a first layer of a metal formed on the base material with a compressive stress, and one or more layers of the metal formed on the first layer, where the one or more layers has a compressive stress different than the compressive stress of the first layer. In an embodiment, the first layer and the one or more layers comprise a superconducting material.

In an alternative embodiment, the structure includes a base material, a thin film on the base material, an area between a first portion of the thin film and a second portion of the thin film where the thin film is partially removed, and a thin film bridge between the first portion and the second portion, where the bridge, the first portion, and the second portion comprise a monolithic structure. In an embodiment, the structure further includes a third portion of the thin film between the first portion and the second portion and not connected to the first portion and the second portion, a fourth portion of the thin film between the first portion and the second portion and not connected to the first portion and the second portion, and a metal line running under the thin film bridge and connecting the third portion to the second portion.

In an embodiment, the structure includes a first metal area on a base material, a second metal area on the base material, a bridge connecting the first metal area and the second area, where the first metal area, the second metal area, and the bridge comprise a monolithic structure, a first metal line between the first metal area on the base material and the second metal area on the base material, a second metal line between the first metal area on the base material and the second metal area on the base material, and a third metal line between the first metal area on the base material and the second metal area on the base material, where the third metal line connects the first metal line and the second metal line. In further embodiment, the first metal line and the second metal line comprise a same material, and the third metal line comprises a material different from the material of the first metal line and the second metal line.

BRIEF DESCRIPTION OF THE DRAWINGS

FIG. 3A depicts a diagram in accordance with an exemplary embodiment of the present invention.

FIG. 3B depicts a diagram in accordance with an exemplary embodiment of the present invention.

FIG. 4A depicts a diagram in accordance with an exemplary embodiment of the present invention.

FIG. 4B depicts a diagram in accordance with an exemplary embodiment of the present invention.

FIG. 4C depicts a diagram in accordance with an exemplary embodiment of the present invention.

DETAILED DESCRIPTION

Figure 1B:
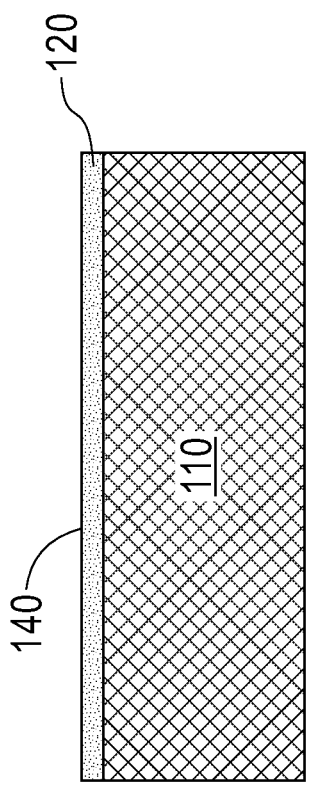
FIG. 1B depicts a diagram in accordance with an exemplary embodiment of the present invention.

The present invention provides a process and structure of microfabricated air bridges for planar microwave resonator circuits. In an embodiment, the process includes depositing a superconducting film on a surface of a base material, where the superconducting film is formed with a compressive stress, where the compressive stress is higher than a critical buckling stress of a defined structure, forming a first photoresist pattern on the superconducting film, where the photoresist pattern defines at least one bridge etching an exposed area of the superconducting film, thereby creating the at least one bridge, etching the base material, thereby forming a gap between the at least one bridge and the base material, forming a second photoresist pattern on at least a defined surface of the base material, where the second photoresist pattern defines a space for at least one metal line, cleaning at least a part of the surface of the superconducting film, depositing the at least one metal line on at least part of the superconducting film and at least part of the base material, where the at least one metal line connects a first part of the superconducting film and a second part of the superconducting film, where the at least one metal line runs under the bridge, and removing the second photoresist pattern.

In an alternative embodiment, the process includes depositing a first superconducting film on a surface of a base material, depositing a second superconducting film on a surface of the first superconducting film, where the second superconducting film is formed with a compressive stress, where the compressive stress is higher than a critical buckling stress of a defined structure, forming a first photoresist pattern on the second superconducting film, where the photoresist pattern defines at least one bridge, etching an exposed area of the second superconducting film, thereby creating the at least one bridge, etching the first superconducting film, thereby forming a gap between the at least one bridge and the base material, forming a second photoresist pattern on at least a defined surface of the base material, where the second photoresist pattern defines a space for at least one metal line, cleaning at least a part of a surface of the second superconducting film, depositing the at least one metal line on at least part of the second superconducting film and at least part of the base material, where the at least one metal line connects a first part of the second superconducting film and a second part of the second superconducting film, where the at least one metal line runs under the bridge, and removing the second photoresist pattern.

In an embodiment, the structure includes a base material, a first layer of a metal formed on the base material with a compressive stress, and one or more layers of the metal formed on the first layer, where the one or more layers has a compressive stress different than the compressive stress of the first layer. In an embodiment, the first layer and the one or more layers comprise a superconducting material.

In an alternative embodiment, the structure includes a base material, a thin film on the base material, an area between a first portion of the thin film and a second portion of the thin film where the thin film is partially removed, and a thin film bridge between the first portion and the second portion, where the bridge, the first portion, and the second portion comprise a monolithic structure. In an embodiment, the structure further includes a third portion of the thin film between the first portion and the second portion and not connected to the first portion and the second portion, a fourth portion of the thin film between the first portion and the second portion and not connected to the first portion and the second portion, and a metal line running under the thin film bridge and connecting the third portion to the second portion.

In an embodiment, the structure includes a first metal area on a base material, a second metal area on the base material, a bridge connecting the first metal area and the second area, where the first metal area, the second metal area, and the bridge comprise a monolithic structure, a first metal line between the first metal area on the base material and the second metal area on the base material, a second metal line between the first metal area on the base material and the second metal area on the base material, and a third metal line between the first metal area on the base material and the second metal area on the base material, where the third metal line connects the first metal line and the second metal line. In further embodiment, the first metal line and the second metal line comprise a same material, and the third metal line comprises a material different from the material of the first metal line and the second metal line.

Superconducting coplanar waveguide (CPW) transmission lines and resonators are integral components of cryogenic detectors for submillimeter electromagnetic radiation, quantum memory elements, and solid-state quantum computing architectures. The desired mode profile of a CPW is symmetric, with the two ground planes on either side of the center trace held to the same electrostatic potential. However, asymmetries and discontinuities in the microwave circuitry can lead to the excitation of spurious slot line modes. These modes can couple to elements of the circuit such as qubits, and they represent a source of loss and decoherence.

Crossover connections between the ground planes that are interrupted by the CPW structure can suppress these spurious modes. Free standing crossovers, known as airbridges, have been a staple of conventional microwave CPW technology and fabrication processes have recently been developed for building airbridges on superconducting microwave circuits. Some methods for fabricating airbridges add processing steps that may degrade the quality of the circuit. In addition, care must be taken in order to avoid accidentally creating tunnel junctions with small critical currents at the interfaces of such structures. In some embodiments, bridges are formed by an additive process of depositing a metal bridge on a film. In an embodiment, the depositing is performed by evaporation. In an embodiment, depositing the at least one metal line is performed by evaporation. This process can lead to weakness in the interface between the metal bridge and the metal film.

In some instances, as the number of qubits in the quantum processor increases, qubits become topologically isolated and hence they become fenced in. Such isolated qubits can be reached by using airbridges at the intersections of signal carrying CPW lines, carrying signal of one line hoping over another. In an embodiment of the present disclosure, bridges carrying a signal are used to hop over another signal carrying line, along with the ground lines. In such a case, the air gap between the center signal carrying bridge (suspended) line and corresponding ground lines has to be adjusted to match the impedance requirements.

In an embodiment, a patterned thin film on a base material including a bridge, a broken line running substantially orthogonal to the bridge structure and interrupted near the bridge structure, a first ground plane on the first side of the broken line and connected to a first end of the bridge, and a second ground plane on a second side of the broken line connected to a second end of the bridge. In an embodiment, the bridge, the first ground plane, and the second ground plane are a monolithic structure. For example, this monolithic structure could result in a much stronger bridge since there is no bridge/film interface as in other air bridge designs. In an embodiment, a second metal is deposited to form an underpass underneath the suspended structure. The second metal is deposited partially on the exposed base material and partially on the thin film of the broken line, thereby connecting two portions of the broken line.

Stress Gradients in Thin Films

In an embodiment of the present invention, thin films are produced with induced stress gradients. In an embodiment, a compressively stressed film is deposited with stress higher than a critical buckling stress of the designed bridge with a stress gradient across the thickness that results in directional buckling (away from the base material). In an embodiment, the thin films are deposited in multiple different layers with varying induced stresses in each layer. In an embodiment, the average stress gradient across the thickness of the bridge is higher than the critical buckling stress of the suspended structure in order to facilitate buckling. In an embodiment, the films are niobium, niobium nitride, titanium nitride, and/or niobium titanium nitride. In an embodiment, the superconducting film comprises a material selected from the group consisting of aluminum and niobium.

In an embodiment, the films are any superconducting film. In an embodiment, the thin films are sputtered on. In an embodiment, the argon content of the sputtering chamber is varied to change the compressive stress in the thin film. In an embodiment, each of the layers of the thin film range from 5 nm to 50 nm. In an embodiment, the thin film thickness ranges from 50 nm to 500 nm thick. In an embodiment, a first sacrificial thin film will be formed without a stress gradient and a second thin film will be formed with a stress gradient.

Buckling

In an embodiment, the average stress across the thickness of the thin film is higher than a critical buckling stress of the designed structure that will be suspended. The compressive stress in the film will cause the designed structure to buckle. In an embodiment, the critical buckling stress of a thin film patterned into a beam (i.e., a bridge) is given by $$\sigma_c = \pi^2 E L^2 / 3 t^2$$ Equation #1 where E, L and t are the young's modulus, length and thickness of the beam respectively. Maximum deflection ($V_{max}$) due to a compressive stress $\sigma > \sigma_c$ is given by $$V_{max} = 2((\sigma/E)(L/\pi)^2 - t^2/3)^{1/2}$$ Equation #2

In an embodiment, the compressive stress, the length, and the thickness of the beam are adjusted to get the desired deflection. For example, length of the bridge structures can be increased without effecting the CPW boundaries by making an underpass for the ground along with the central signal carrying line. For example, it could be necessary to make the width of the bridge structure larger than the thickness, to avoid lateral buckling of the beam. Once the buckling is limited to the vertical direction, preferential upward buckling, as opposed to downward buckling, could be achieved by having a stress gradient across the thickness of the film, as long as the average compressive stress across the thickness is higher than critical buckling stress, as required to achieve buckling. In an embodiment, the film is formed of multiple layers, and a compressive stress of each layer is different than the compressive stress of a previous layer. In an embodiment, a compressive stress of each of the one or more layers is different than a compressive stress of a previous layer among the first layer and the one or more layers. In an embodiment, the layer is a superconducting material.

First Photoresist Layer

In an embodiment, photoresist is applied to the surface of the thin film such that an area of the thin film that is to be etched away is left exposed. The photoresist is exposed using a light source and subsequently developed. For example, the photoresist could be exposed to light or cured using a laser to pattern the cured areas or an ultraviolet (UV) lamp with a mask shading the areas that are not intended to be exposed to light. In an embodiment, the photoresist is exposed in a lithographic stepper or scanner. In an embodiment, a portion of the photoresist is removed.

In an embodiment, the photoresist is a positive photoresist. In a positive photoresist, a portion of the photoresist that is exposed to light becomes soluble to a photoresist developer while the unexposed portion of the photoresist remain insoluble to the photoresist developer.

In an embodiment, the photoresist is a negative photoresist. In a negative photoresist, a portion of the photoresist that is exposed to light becomes insoluble to a photoresist developer while the unexposed portion of the photoresist is soluble to the photoresist developer.

In an embodiment, a photoresist layer is a positive tone photoresist material and a positive tone development process removes the exposed portion of the photoresist layer. In an embodiment, the photoresist layer is a negative tone photoresist material and a negative tone development process removes unexposed portions of the photoresist layer. In an embodiment, a photoresist developer is a liquid that dissolves unexposed or uncured resin in a negative tone photoresist. In an embodiment, a photoresist developer is a liquid that dissolves exposed or cured resin in a positive tone photoresist. The resist development process results in of a portion of the sample surface with the thin film and a portion of the sample surface coated with photoresist. Subsequently, the resist pattern is transferred to the thin film by etching. In an embodiment, a stripping process is performed after an etching to remove the remainder of the photoresist.

Etching of Superconductor

In an embodiment, the thin film is a superconducting material. In an embodiment, an etching process is used to remove a portion of the superconducting material. For example, material is removed such that conductive lines are formed on the surface of the base material. In an embodiment, the portion of the superconducting material that is removed is defined by the photoresist left after development. In an embodiment, the bridge is defined by the etching process. In an embodiment, the etching is a dry etching process. For example, the etching gases could contain chlorine, chlorinated molecules, and/or fluorinated molecules. In an embodiment, the etching process includes etching, until a system detects the base material and then stops the etching process. In an embodiment, the etching process is anisotropic. In an embodiment, the bridge is 300 nm to 10 µm wide. In an embodiment, the length of an underpass line under the bridge is approximately 2 to 30 times the width of the bridge depending on the frequency and impedance requirements of the circuit. In an embodiment, the ratio of the width of the bridge to the width of the underpass line is tailored to optimize the performance for a desired application. In an embodiment, the underpass line is a signal line.

In an embodiment, the pattern is designed such that the photoresist mask on the bridge is formed with holes. In an embodiment, the smallest lateral dimension of the bridge is larger than the thickness of the film. In an embodiment, the pattern is designed such that the bridge will be multiple substantially parallel bridges. For example, the bridge could actually be two bridges with crossbeams connecting the two bridges. In an embodiment, the etching could form the bridge into a mesh shape with multiple holes. In an embodiment, the first photo resist pattern defines a set of one or more holes, where the set of one or more holes is sized such that the base material can be etched through the one or more holes, and where the set of one or more holes is sized such that metal cannot be deposited through the set of one or more holes. In an embodiment, the first photo resist pattern defines a set of one or more holes, where the set of one or more holes is sized such that metal can be deposited through the set of one or more holes. In an embodiment, the deposited metal is aluminum.

Underpass Photoresist Layer

In an embodiment, a photoresist is applied to control the etching of the base material under the bridge. For example, a photoresist could be applied, similar to before, to outline the area underneath the bridge where the base material is to be etched away, such that the base material in other parts is covered by photoresist during a base material etching process.

In an embodiment, a photoresist is not applied to control the etching of the base material. For example, the base material (i.e., the base material is silicon) could be etched from substantially everywhere on the surface that the superconducting material is exposed.

Etching Underpass

In an embodiment, the base material under the bridge is etched away to release it from the substrate. Once released, the compressive stress in the bridge buckles the bridge, away from the base material, to form an overpass. In an embodiment, the etching of the base material (for example, silicon) is an isotropic process. In an embodiment, the vertical depth of the etch is defined by the desired lateral etch required to release the bridge. In an embodiment, the depth could be tailored to increase performance of a component. In an embodiment, the gap spacing between the bridge and the underpass is designed to permit significant transmission through the coplanar waveguide (CPW). In an embodiment, the gap is designed for minimizing the transmission loss. In an embodiment, once the base material is sufficiently etched under the bridge, the compressive stress in the bridge will cause the bridge to buckle up. In an embodiment, the gap is increased by controlling the length of the bridge. For example, increasing the length of the bridge will increase the gap.

Figure 1C:
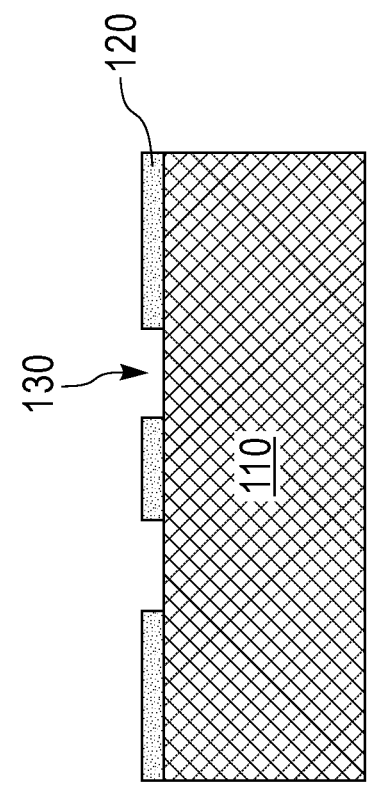
FIG. 1C depicts a diagram in accordance with an exemplary embodiment of the present invention.
Figure 1A:
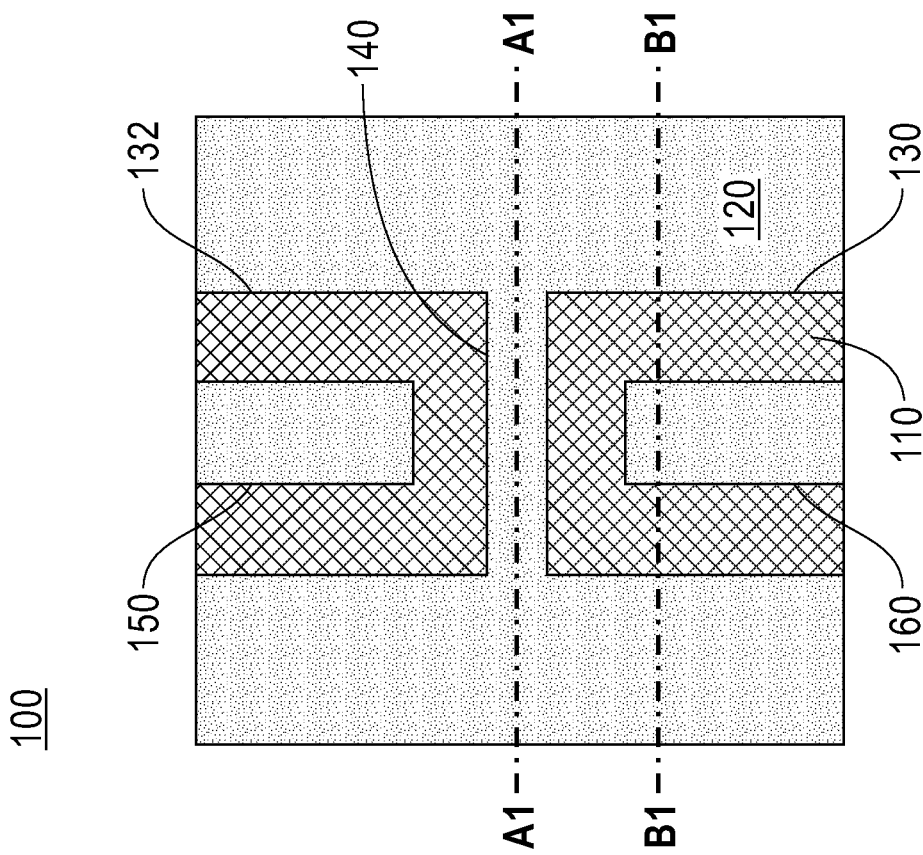
FIG. 1A depicts a diagram in accordance with an exemplary embodiment of the present invention.

Referring to FIG. 1A-1C, in an embodiment, a metal coating 120 is deposited onto a base material 110. Metal coating 120 is deposited in such a way such that metal coating 120 has a gradient of compressive stress across its thickness. A portion of metal coating 120 is removed forming channels 130 and 132, and leaving metal lines 140, 150, and 160. FIG. 1B is a cross section of a structure 100 at A1. FIG. 1C is a cross section of structure 100 at B1. The width of metal line 140 and the width of metal lines 150 and 160 can be tailored depending the requirements of structure 100. In an embodiment, the first metal line, the second metal line and the third metal line are not indicative of an order, but instead used as differentiation between different lines.

Figure 1E:
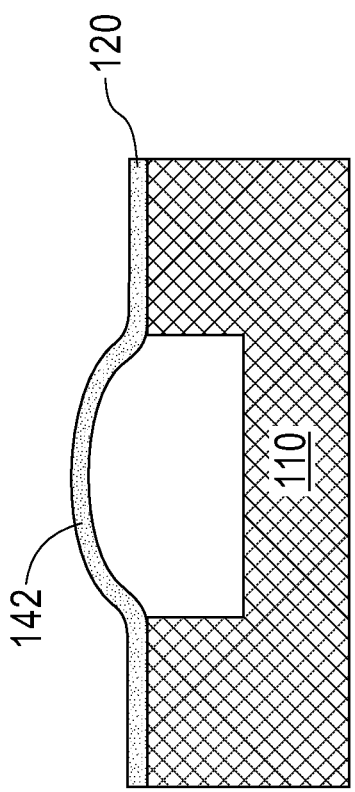
FIG. 1E depicts a diagram in accordance with an exemplary embodiment of the present invention.
Figure 1F:
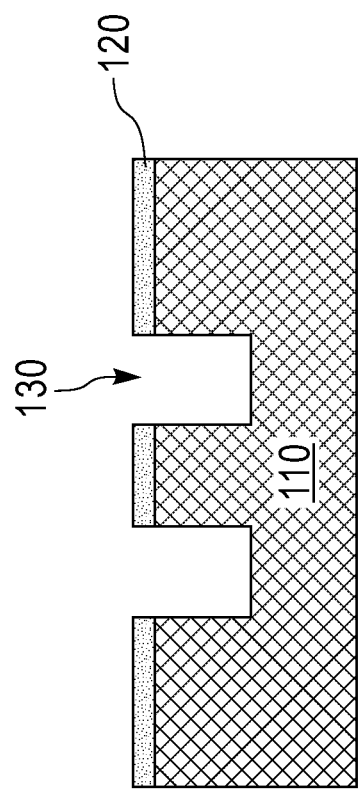
FIG. 1F depicts a diagram in accordance with an exemplary embodiment of the present invention.
Figure 1D:
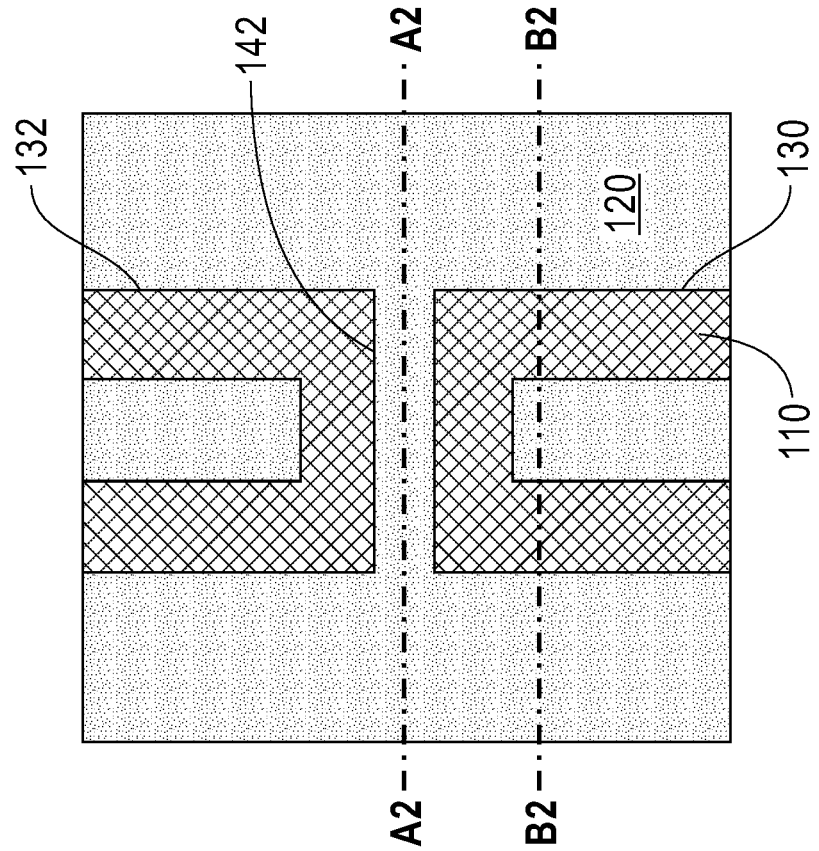
FIG. 1D depicts a diagram in accordance with an exemplary embodiment of the present invention.

Referring to FIG. 1D-1F, in an embodiment, a portion of base material 110 is removed from channels 130 and 132 and under metal line 140. Once base material 110 is removed from underneath metal line 140, metal line 140 arcs out from structure 100, due to the compressive stresses across the thickness of metal coating 120, to form a bridge 142. FIG. 1E is a cross section of structure 100 at A2. FIG. 1F is a cross section of structure 100 at B2. The resist mask that is used to pattern metal coating 120 and/or base material 110 is not shown in FIG. 1A-1F. In an embodiment, the remaining resist is removed after completion of the etch. In an embodiment, there is a delamination between metal coating 120 and base material 110 where bridge 142 meets the attached portion of metal coating 120.

Figure 1H:
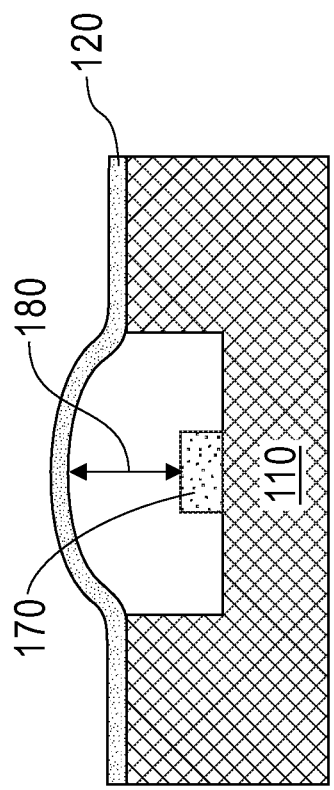
FIG. 1H depicts a diagram in accordance with an exemplary embodiment of the present invention.
Figure 1I:
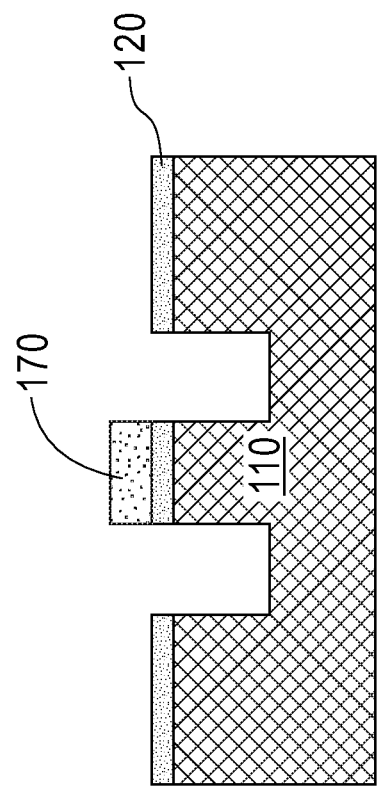
FIG. 1I depicts a diagram in accordance with an exemplary embodiment of the present invention.
Figure 1G:
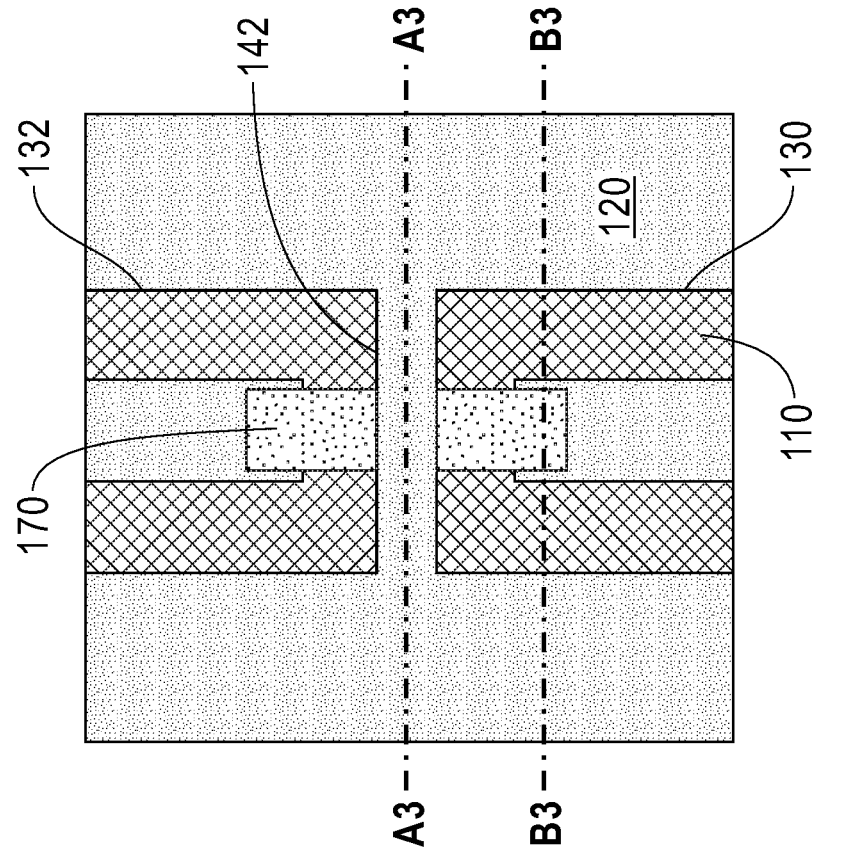
FIG. 1G depicts a diagram in accordance with an exemplary embodiment of the present invention.

Referring to FIG. 1G-1I, in an embodiment, a connecting metal line 170 is deposited on metal lines 150, 160 and on base material 110, such that metal lines 150 and 160 are connected under bridge 142 without contacting bridge 142. In an embodiment, the surface of metal coating 120, including metal lines 150 and 160, are cleaned before deposition. In an embodiment, connecting metal line 170 is a continuous line. In an embodiment, metal line 170 is substantially the same width as metal lines 150 and 160. In an embodiment, metal line 170 is slightly wider or narrower than metal lines 150 and 160. FIG. 1H is a cross section of structure 100 at A3. In an embodiment, not shown, base material 110 will be undercut by the etching process. For example, in FIG. 1I, base material 110 could be partially removed under metal coating 120 such that channel 130 would be wider than depicted in some areas. Likewise, in an embodiment, the etching process removes material such that the resulting channel structure has rounded walls and corners instead of the straight edges and the sharp corners depicted (for example, straight walls and sharp corners as shown by channel 130). FIG. 1I is a cross section of structure 100 at B3. In an embodiment, a gap 180 is controlled based on the design of the bridge.

Sacrificial Material

In an embodiment, a sacrificial material is used underneath the bridge structure. In an embodiment, the sacrificial material is a superconducting material. In an embodiment, the sacrificial material is deposited on the substrate before the deposition of the thin film. For example, a sacrificial superconducting material could be deposited on the surface of the base material and a thin film (i.e., a multilayer superconducting material) could be deposited on the surface of the sacrificial superconducting material. In an embodiment, the sacrificial superconducting material is 5-500 nm thick. In an embodiment, the sacrificial superconducting material and the multilayer superconducting material are different materials. For example, the sacrificial superconducting material could be Titanium, Titanium Nitride, and/or Aluminum, and the multilayer superconducting material could be Niobium or Niobium Nitride.

In an embodiment, a photoresist is deposited and patterned, and a first etching is performed. In an embodiment, in the first etching, only the multilayer superconducting material is substantially etched away in the area where there is no photoresist pattern. In an embodiment, in the first etching, both the multilayer superconducting material and the sacrificial superconducting material are etched away in the area where there is no photoresist pattern. In an embodiment, a second superconducting material etching is performed, where the etchant is specifically designed to etch away the sacrificial superconducting material (exposed by the first etching) and leave the majority of the multilayer superconducting material. For example, the first etching could define a metal line and a bridge structure. The second etching could undercut the sacrificial superconducting material from under the bridge structure, thereby releasing the bridge structure from the superconducting material.

Figure 2B:
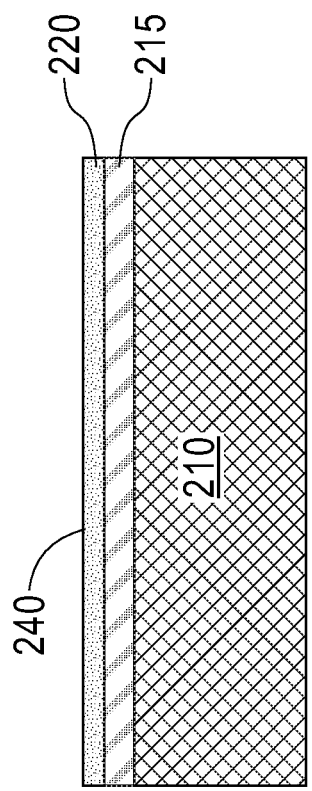
FIG. 2B depicts a diagram in accordance with an exemplary embodiment of the present invention.
Figure 2C:
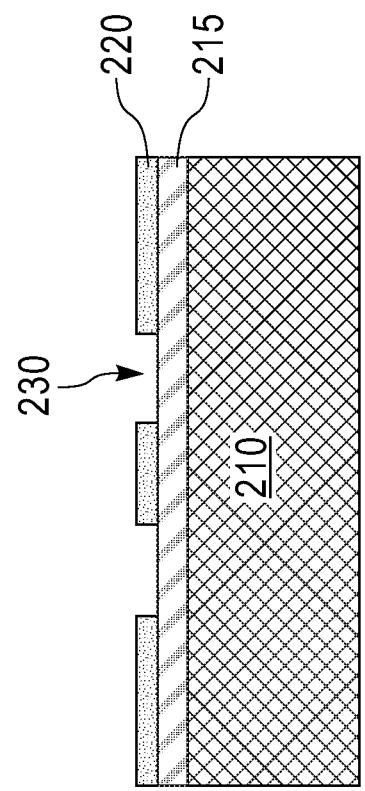
FIG. 2C depicts a diagram in accordance with an exemplary embodiment of the present invention.
Figure 2A:
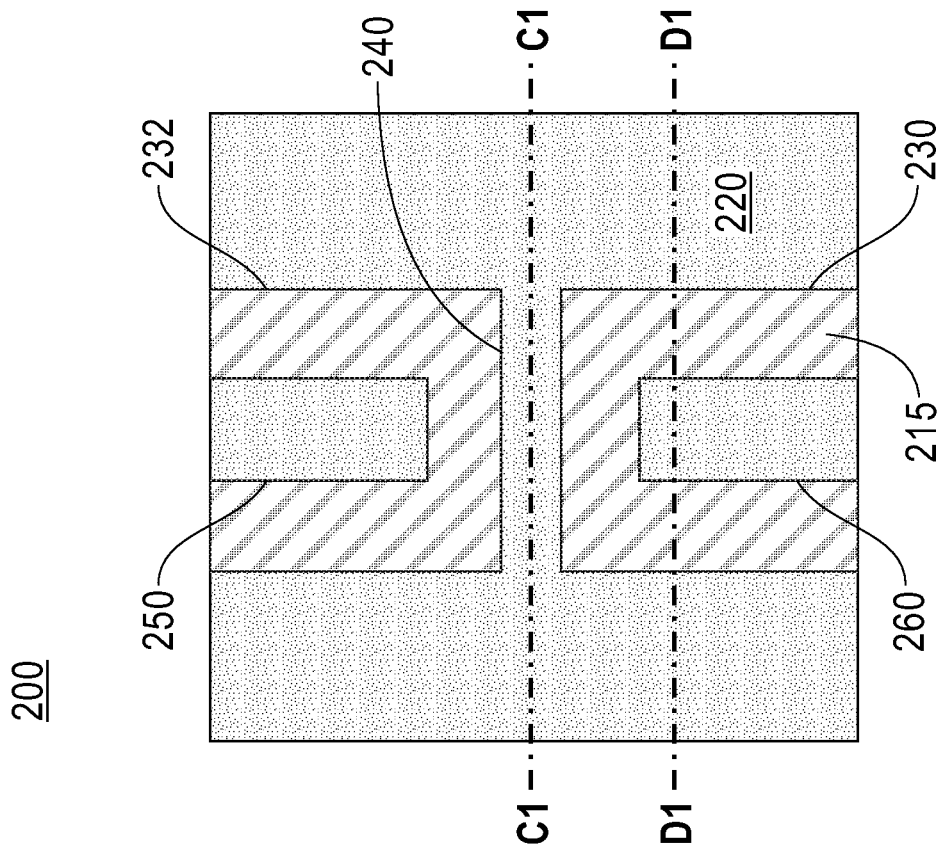
FIG. 2A depicts a diagram in accordance with an exemplary embodiment of the present invention.

Referring to FIG. 2A-2C, in an embodiment, a sacrificial layer 215 is first deposited on a base material 210 and a metal coating 220 is placed on sacrificial layer 215. In an embodiment, base material 210 is silicon, metal coating 220 is a superconducting material, and sacrificial layer 215 is a superconducting material. A portion of metal coating 220 is removed forming channels 230 and 232, and leaving a metal line 240 and metal lines 250 and 260. FIG. 2B is a cross section of a structure 200 at C1. FIG. 2C is a cross section of structure 200 at D1.

Figure 2E:
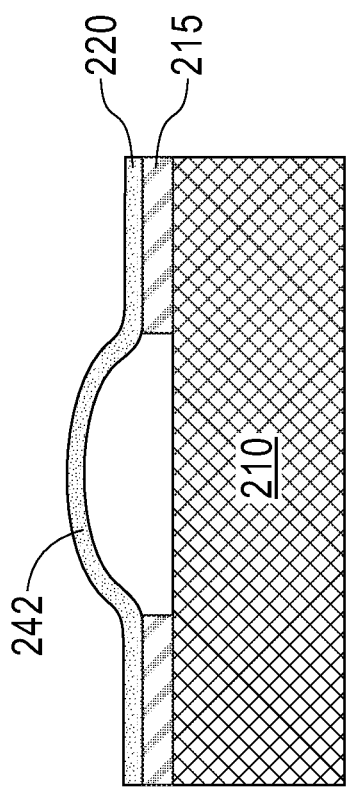
FIG. 2E depicts a diagram in accordance with an exemplary embodiment of the present invention.
Figure 2F:
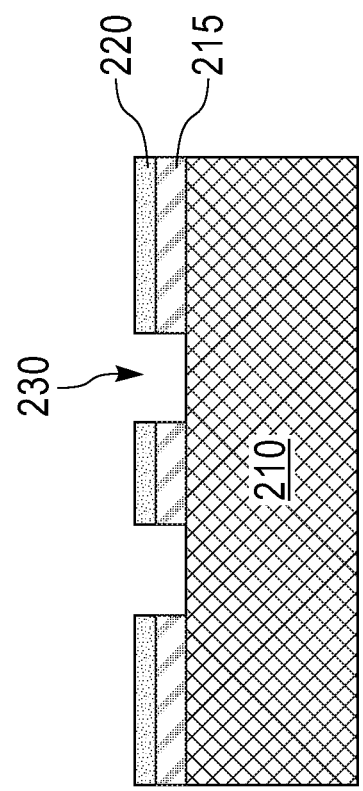
FIG. 2F depicts a diagram in accordance with an exemplary embodiment of the present invention.
Figure 2D:
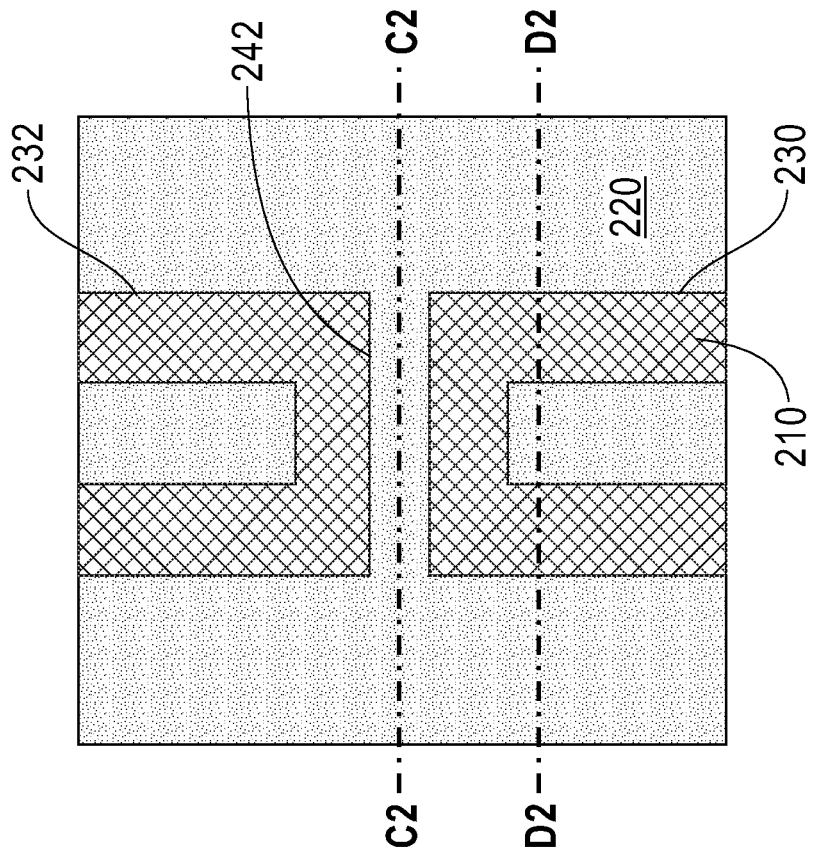
FIG. 2D depicts a diagram in accordance with an exemplary embodiment of the present invention.

Referring to FIG. 2D-2F, in an embodiment, a portion of sacrificial layer 215 is removed from channels 230 and 232 and under metal line 240. Once sacrificial layer 215 is removed from underneath metal line 240, metal line 240 arcs out from base material 210, due to the compressive stresses across the thickness of metal coating 220, to form a bridge 242. In an embodiment, once sacrificial layer 215 is removed base material 210 is etched away. In an embodiment, once sacrificial layer 215 is removed base material 210 is not etched away. FIG. 2E is a cross section of structure 200 at C2. FIG. 2F is a cross section of structure 200 at D2. In an embodiment, sacrificial layer 215 is undercut during the etching process such that a portion of sacrificial layer 215 near the edge of a channel, such as channel 230, would be removed. In an embodiment, metal coating 220 and bridge 242 are substantially the same thickness. In an embodiment, there is a slight delamination between metal coating 220 and sacrificial layer 215 where bridge 242 meets the attached portion of metal coating 220. In an embodiment, there is a slight delamination between sacrificial layer 215 and base material 210 where bridge 242 meets the attached portion of metal coating 220. In an embodiment, the etching process would undercut metal coating 220 such that a portion of sacrificial layer 215 would be removed under metal coating 220.

Figure 2H:
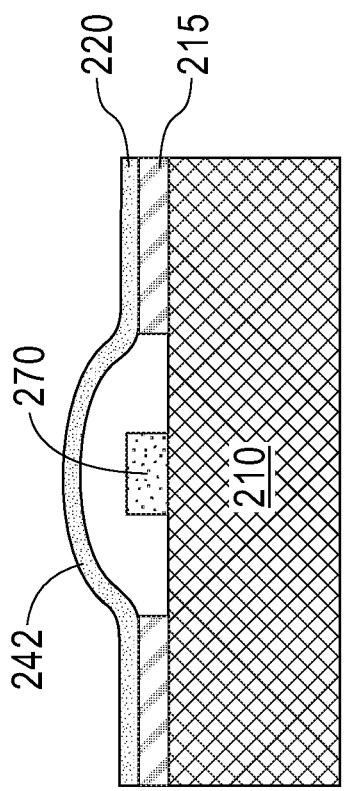
FIG. 2H depicts a diagram in accordance with an exemplary embodiment of the present invention.
Figure 2I:
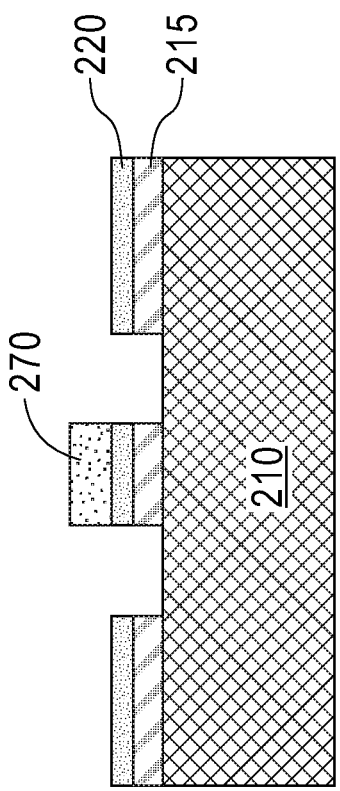
FIG. 2I depicts a diagram in accordance with an exemplary embodiment of the present invention.
Figure 2G:
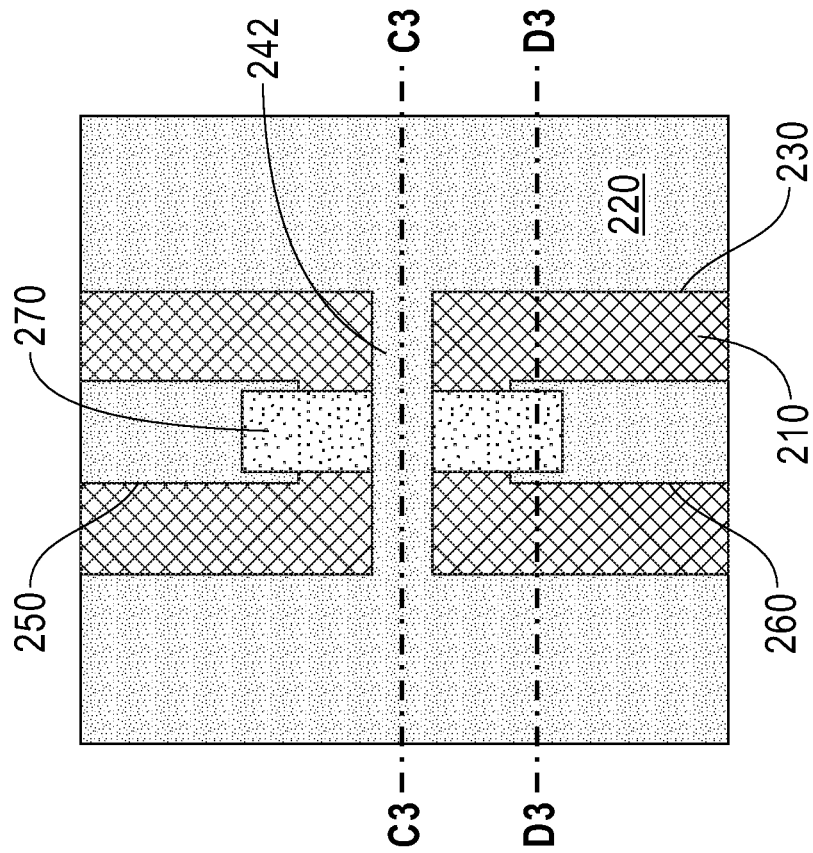
FIG. 2G depicts a diagram in accordance with an exemplary embodiment of the present invention.

Referring to FIG. 2G-2I, in an embodiment, a connecting metal line 270 is deposited on metal lines 250, 260 and on base material 210, such that metal lines 250 and 260 are connected under bridge 242 without connecting metal line 270 contacting bridge 242. In an embodiment, connecting metal line 270 is also partially deposited on an exposed portion of sacrificial layer 215 under the edge of metal lines 250 and 260. In an embodiment, metal line 270 is substantially the same width as metal lines 250 and 260. In an embodiment, metal line 270 is slightly wider or narrower than metal lines 250 and 260. In an embodiment, the surface of metal coating 220, including metal lines 250 and 260 is cleaned before deposition. In an embodiment, connecting metal line 270 is a continuous line without any breaks. FIG. 2H is a cross section of structure 200 at C3. FIG. 2I is a cross section of structure 200 at D3. In an embodiment, a gap between connecting metal line 270 and bridge 242 is controlled based on the design of the bridge. In an embodiment, the connecting metal line is at least one metal line, and the at least one metal line is aluminum.

Lift Off Resist

In an embodiment, a lift off process is used to form a metal line running under the bridge on the base material. A lift off layer is applied to the surface of the substrate, then a photoresist layer is applied to the surface of the lift off layer. The photoresist is cured and developed, as before, leaving a pattern in the photoresist corresponding to a path for the metal line. In an embodiment, the lift off resist, in the path for the metal line, is removed during the development step. For example, the lift off resist could be removed/etched by the photoresist developer or a different material and/or process. In an embodiment, the lift off resist is removed where the photoresist pattern is removed. For example, in an area where the photoresist is removed, the uncovered lift off resist could be washed away. There could be some undercutting of the lift off resist underneath of the photoresist during the development process. In an embodiment, the shadow of the bridge could cause the photoresist to not be cured under the bridge. In an embodiment, an undercutting of the lift off resist, during the development process, will remove the lift off resist underneath the photoresist under the bridge creating a continuous path for the metal line to be deposited into. In an embodiment, a metal line is deposited underneath the bridge structure. For example, a resist process could be used to define a channel for the metal line to be deposited in. In an embodiment, photolithography has an optical proximity effect that allows development of an area of the resist under the bridge that does not have line of sight to the source of the photons. Unexposed resist underneath the bridge, if needed, can be removed by overdeveloping the resist after the optical exposure. In an embodiment, a defined surface of the base material is the exposed surface of the base material where the at least one metal line will not be deposited, such that the area without resist will be where the at least one metal line will be deposited. In an embodiment, the resist is formed on other surfaces (such as the surface of the metal coating) such that substantially all of a top surface of the entire formed structure is coated with the resist except where the at least one metal line will be formed.

Electron-Beam Lithography

In an embodiment, electron-beam lithography (EBL) is used to expose the resist. In EBL, a beam of electrons exposes the portions of the resist that are to be developed (for a positive tone resist). Scattering of electrons to areas nearby the exposed areas causes a proximity effect, where, for example, the resist under the bridge that does not have line of sight to the source of the electrons can be exposed.

Aluminum Deposition

In an embodiment, aluminum is deposited on the surface of the substrate at a steep angle. In an embodiment, the surface of the superconducting metal is ion milled to remove any built-up oxide layer before aluminum deposition. In an embodiment, the aluminum for the underpass is deposited in a lift off process.

Bridge Design

In an embodiment, the bridge can be designed with holes. In an embodiment, the bridge can be designed without holes. In an embodiment, a first set of holes will be large enough to allow etching of the base material or sacrificial superconducting metal under the bridge, but not large enough to allow aluminum deposition under the bridge where it is not desired. In an embodiment, a first set of holes will be small enough to allow etching of the base material or sacrificial superconducting metal under the bridge, but not large enough to allow aluminum deposition under the bridge. In an embodiment, a second set of one or more holes in the bridge are large enough to allow aluminum deposition under the bridge.

Referring to FIGS. 3A and 3B, in an embodiment, the bridge structure is formed with cutouts, such as holes 390 and a rectangle 395. For example, holes 390 and rectangle 395 can be removed from a metal coating 320 during etching. In an embodiment, holes 390 are designed to allow a base material to be etched away, but not large enough for metal to be deposited on the base material underneath the bridge when a connecting metal line 370 is deposited. In an embodiment, connecting metal line 370 is substantially the same width as metal lines 350 and 360. In an embodiment, rectangle 395 is positioned over the area where connecting metal line 370 is to be deposited. For example, rectangle 395 can be designed to be large enough for the base material to be etched away and connecting metal line 370 to be deposited. In an embodiment, connecting metal line 370 will be substantially the same width as rectangle 395. In an embodiment, connecting metal line 370 may be slightly wider or narrower than rectangle 395.

Referring to FIG. 4A-4C, in an embodiment, a bridge structure is formed on a component 400 with multiple sets of holes 490 and rectangles 495, such that multiple areas under the bridge have base material etched away, and multiple areas can have connecting metal lines 471, 472, and 473 deposited. For example, connecting metal line 471 could be deposited such that an area 452 is connected to an area 462 through connecting metal line 471. For example, connecting metal line 472 could be deposited such that a metal line 450 is connected to a metal line 460 through connecting metal line 472. For example, connecting metal line 471 could be deposited such that an area 454 is connected to an area 464 through connecting metal line 473.

Buckling Inducement

In an embodiment, it may be necessary to apply external forces to cause the suspended structure (i.e., a bridge) to buckle outwards. For example, a voltage bias could be applied to the bridge and a ground structure could be placed near the bridge to cause the bridge to buckle outwards. In an embodiment, the bridge is pulled away from the base material. In an embodiment, the method of fabricating the bridge includes pulling the at least one bridge away from the base material. In an embodiment, the bridge is at least one bridge. In an embodiment, the pulling comprises pulling the at least one bridge away from the base material by using electrostatic force. In an embodiment, the pulling is performed using electrostatic force. In an embodiment, outwards means away from the base material.

Figure 5:
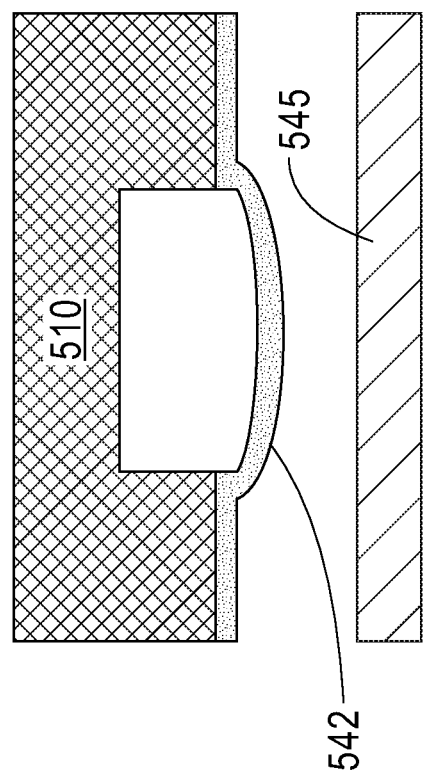
FIG. 5 depicts a diagram in accordance with an exemplary embodiment of the present invention.

Referring to FIG. 5, in an embodiment, a voltage bias is used to facilitate buckling of a bridge structure 542. FIG. 5 is a cross section of a bridge structure according to an embodiment of the present disclosure. In an embodiment, a negative charge is applied to a ground structure 545 and a positive charge is applied to bridge structure 542 such that bridge structure 542 is induced to buckle away from a base material 510. In an embodiment, the voltage bias could be done before depositing a connecting metal line (such as metal lines 170, 270, and 370). In an embodiment, the voltage bias could be done after depositing a connecting metal line (such as metal lines 170, 270, and 370). In an embodiment, the voltage bias could be used to facilitate buckling of bridge structure 542 any time after the formation of bridge structure 542.

Test Structure

Figure 6:
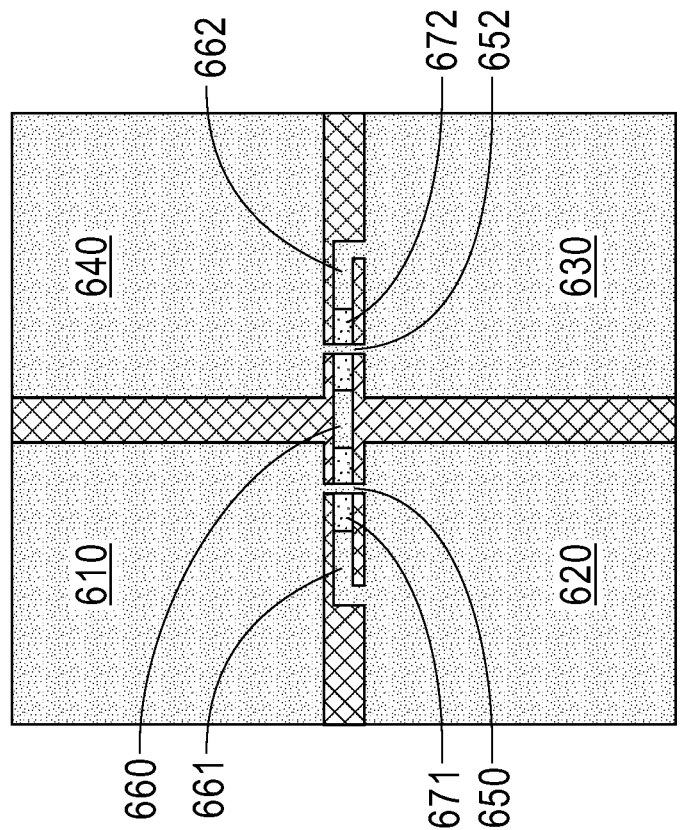
FIG. 6 depicts a diagram in accordance with an exemplary embodiment of the present invention.

Referring to FIG. 6, in an embodiment, a test structure is formed to test the bridge structure fabrication. In an embodiment, the test structure has four contact pads. A first contact pad 610 is connected to a second contact pad 620 by a bridge 650, created according to an embodiment of the present disclosure. Second contact pad 620 is connected to a third contact pad 630 by an underpass, created according to an embodiment of the present disclosure. For example, the underpass could be comprised of metal lines 661, 662, and 660 formed from a metal coating, and connecting metal lines 671 and 672 formed under bridges 650 and 652. Connecting metal line 671 could connect metal line 661 to metal line 660 without directly touching bridge 650. For example, connecting metal line 672 could connect metal line 662 to metal line 660 without directly touching bridge 652. Third contact pad 630 is connected to a fourth contact pad 640 pad by bridge 652, created according to an embodiment of the present disclosure. In an embodiment, the bridge and underpass structures can be tested by measuring the connectivity between the various contact pads. For example, a conductivity between first contact pad 610 and second contact pad 620 signifies properly formed bridge 650. A complete connection between second contact pad 620 and third contact pad 630 could signify properly formed metal lines 671 and 672 in the underpass. A complete connection between third contact pad 630 and fourth contact pad 640 could signify a properly formed second bridge 652 between third contact pad 630 and fourth contact pad 640. In an embodiment, the conductivity between each contact pad will have an expected range of resistance. For example, the conductive path between first contact pad 610 and fourth contact pad 640 could have a different resistance from the conductive path between first contact pad 610 and third contact pad 630. In an embodiment, a variation of that expected resistance signifies an improperly formed part.

Figure 7:
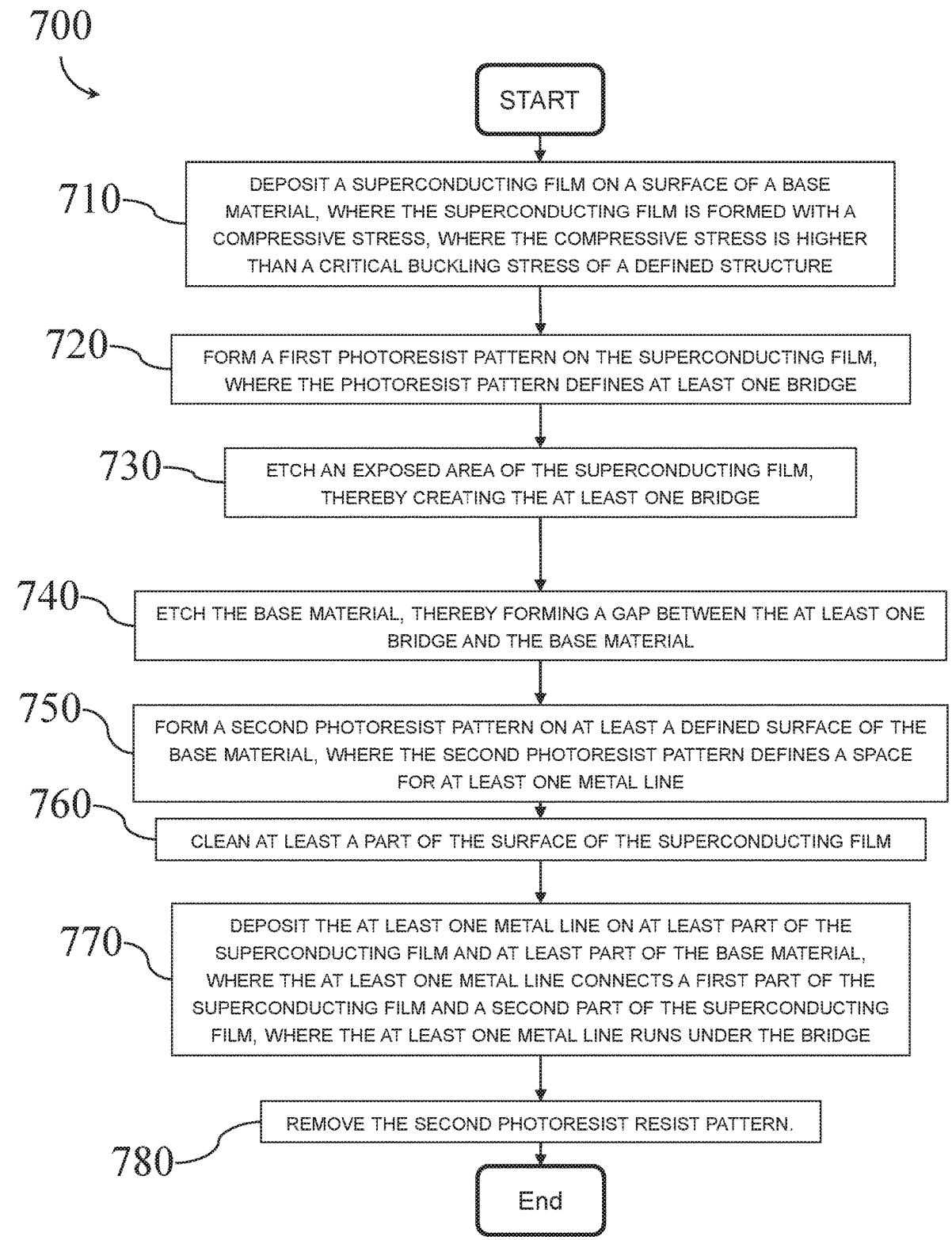
FIG. 7 depicts a flow diagram in accordance with an exemplary embodiment of the present invention.

Referring to FIG. 7, in an exemplary embodiment, a method 700 of the present invention is configured to perform an operation 710 of depositing a superconducting film on a surface of a base material, wherein the superconducting film is formed with a compressive stress, wherein the compressive stress is higher than a critical buckling stress of a defined structure, operation 720 of forming a first photoresist pattern on the superconducting film, wherein the photoresist pattern defines at least one bridge, operation 730 of etching an exposed area of the superconducting film, wherein the etching of the exposed area of the superconducting film creates the at least one bridge, operation 740 of etching the base material, wherein the etching of the base material forms a gap between the at least one bridge and the base material, operation 750 of forming a second photoresist pattern on the surface, wherein the second photoresist pattern defines a space for at least one metal line, operation 760 of cleaning at least a part of the surface of the superconducting film, operation 770 of depositing the at least one metal line on at least part of the superconducting film and at least part of the base material, wherein at least the metal line connects a first part of the superconducting film and a second part of the superconducting film, wherein the at least one metal line runs under the bridge, and operation 780 of removing the second photoresist pattern.

Figure 8:
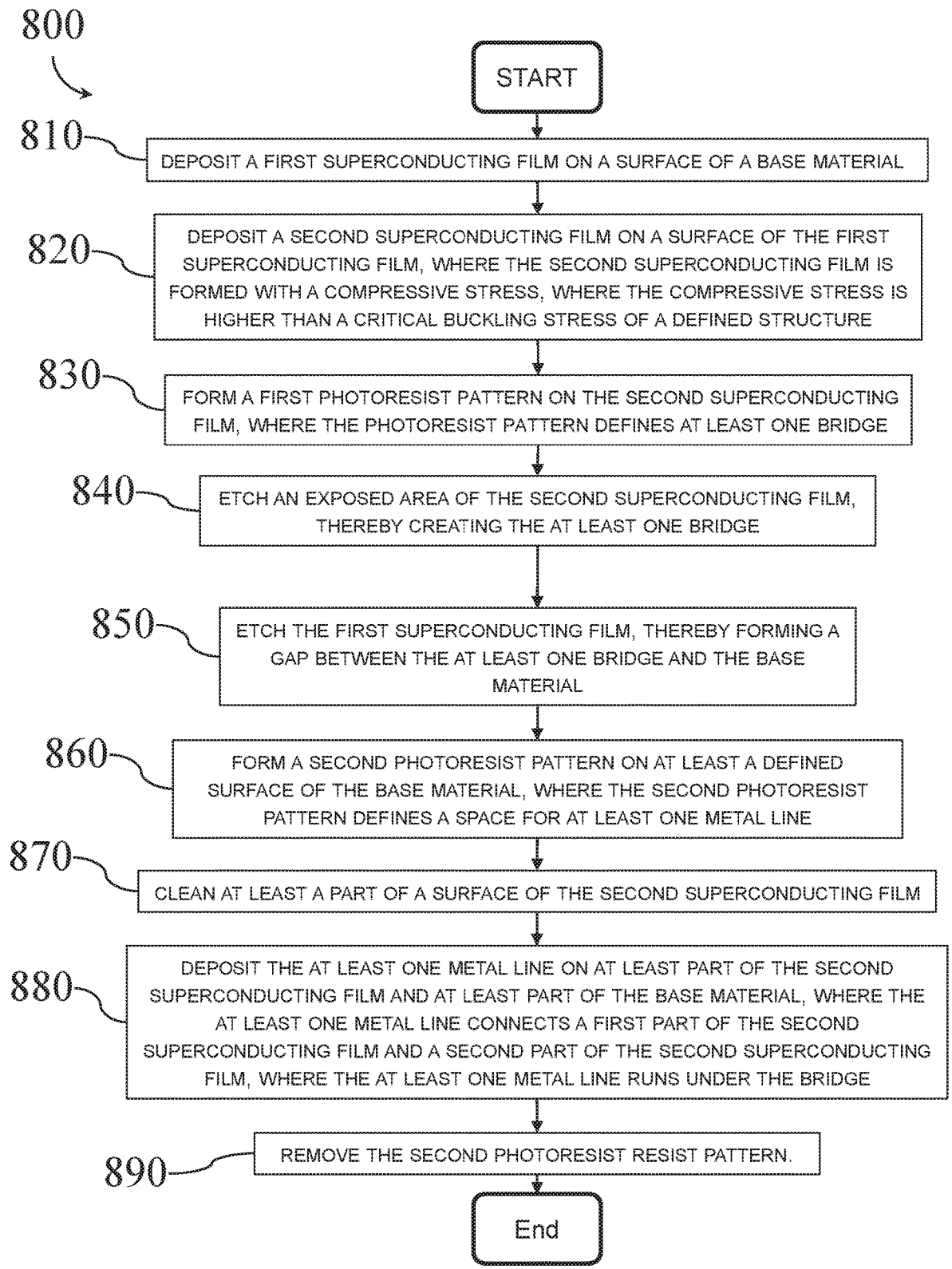
FIG. 8 depicts a flow diagram in accordance with an exemplary embodiment of the present invention.

Referring to FIG. 8, in an exemplary embodiment, a method 800 of present invention is configured to perform an operation 810 of depositing a first superconducting film on a surface of a base material, operation 820 of depositing a second superconducting film on a surface of the first superconducting film, wherein the second superconducting film is formed with a compressive stress, wherein the compressive stress is higher than a critical buckling stress of a defined structure, operation 830 of forming a first photoresist pattern on the second superconducting film, wherein the photoresist pattern defines at least one bridge, operation 840 of etching an exposed area of the second superconducting film, wherein the etching of the exposed area of the second superconducting film creates the at least one bridge, operation 850 of etching the first superconducting film, wherein the etching of the first superconducting film forms a gap between the at least one bridge and the base material, operation 860 of forming a second photoresist pattern on at least an exposed surface of the base material, wherein the second photoresist pattern defines a space for at least one metal line, operation 870 of cleaning at least a part of a surface of the second superconducting film, operation 880 of depositing the at least one metal line on at least part of the second superconducting film and at least part of the base material, wherein at least the metal line connects a first part of the second superconducting film and a second part of the second superconducting film, wherein the at least one metal line runs under the bridge, and operation 890 of removing the second photoresist pattern.

It will be understood that when an element is described as being "connected," "deposited on," or "coupled" to or with another element, it can be directly connected or coupled to the other element or, instead, one or more intervening elements may be present.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

"Present invention" does not create an absolute indication and/or implication that the described subject matter is covered by the initial set of claims, as filed, by any as-amended set of claims drafted during prosecution, and/or by the final set of claims allowed through patent prosecution and included in the issued patent. The term "present invention" is used to assist in indicating a portion or multiple portions of the disclosure that might possibly include an advancement or multiple advancements over the state of the art. This understanding of the term "present invention" and the indications and/or implications thereof are tentative and provisional and are subject to change during the course of patent prosecution as relevant information is developed and as the claims may be amended.

"And/or" is the inclusive disjunction, also known as the logical disjunction and commonly known as the "inclusive or." For example, the phrase "A, B, and/or C," means that at least one of A or B or C is true; and "A, B, and/or C" is only false if each of A and B and C is false.

What is claimed is:

1. A process comprising:
depositing a superconducting film on a surface of a base material,
wherein the superconducting film is formed with a compressive stress,
wherein the compressive stress is higher than a critical buckling stress of a defined structure;
forming a first photoresist pattern on the superconducting film,
wherein the first photoresist pattern defines at least one bridge;
etching an exposed area of the superconducting film, thereby creating the at least one bridge; and
etching the base material, thereby forming a gap between the at least one bridge and the base material.

2. The process of claim 1 further comprising pulling the at least one bridge away from the base material.

3. The process of claim 2, wherein the pulling comprises pulling the at least one bridge away from the base material by using electrostatic force.

4. The process of claim 1, further comprising:
depositing at least one metal line on at least part of the superconducting film and at least part of the base material,
wherein the at least one metal line connects a first part of the superconducting film and a second part of the superconducting film, and
wherein the at least one metal line runs under the bridge.

5. The process of claim 1,
wherein the first photoresist pattern defines a set of one or more holes,
wherein the set of one or more holes is sized such that the base material can be etched through the one or more holes, and
wherein the set of one or more holes is sized such that metal cannot be deposited through the set of one or more holes.

6. The process of claim 1,
wherein the first photoresist pattern defines a set of one or more holes,
wherein the set of one or more holes is sized such that metal can be deposited through the set of one or more holes.

7. The process of claim 1, wherein the base material is silicon.

8. The process of claim 1, wherein the superconducting film comprises a material selected from the group consisting of aluminum and niobium.

9. The process of claim 1, further comprising:
forming a second photoresist pattern on at least a defined surface of the base material.

10. A process comprising:
depositing a first superconducting film on a surface of a base material;
depositing a second superconducting film on a surface of the first superconducting film,
wherein the second superconducting film is formed with a compressive stress,
wherein the compressive stress is higher than a critical buckling stress of a defined structure;
forming a first photoresist pattern on the second superconducting film,
wherein the first photoresist pattern defines at least one bridge,
etching an exposed area of the second superconducting film, thereby creating the at least one bridge; and
etching the first superconducting film, thereby forming a gap between the at least one bridge and the base material.

11. The process of claim 10 further comprising pulling the at least one bridge away from the base material.

12. The process of claim 11, wherein the pulling comprises pulling the at least one bridge away from the base material by using electrostatic force.

13. The process of claim 10,
wherein the first photoresist pattern defines a set of one or more holes,
wherein the set of one or more holes is sized such that the base material can be etched through the one or more holes, and
wherein the set of one or more holes is sized such that aluminum cannot be deposited through the set of one or more holes.

14. The process of claim 10,
wherein the first photoresist pattern defines a set of one or more holes,
wherein the set of one or more holes is sized such that metal can be deposited through the set of one or more holes.

15. The process of claim 10, wherein the base material is silicon.

16. The process of claim 10, wherein the first superconducting film comprises a material selected from the group consisting of aluminum and niobium.

* * * * *